United States Patent
Baeli et al.

(10) Patent No.: US 10,249,082 B1
(45) Date of Patent: Apr. 2, 2019

(54) VISUAL OPTIMIZATION OF THREE DIMENSIONAL MODELS IN COMPUTER AUTOMATED DESIGN

(71) Applicant: Metaverse Technologies Limited, Ennis (IE)

(72) Inventors: Fabrice Baeli, Suresnes (FR); Cedric Rousteau, Le-Plessis-Brion (FR)

(73) Assignee: Metaverse Technologies Limited, Ennis (IE)

( * ) Notice: Subject to any disclaimer, the term of this patent is extended or adjusted under 35 U.S.C. 154(b) by 0 days.

(21) Appl. No.: 15/709,351

(22) Filed: Sep. 19, 2017

(51) Int. Cl.
- *G06T 19/00* (2011.01)
- *G06T 17/10* (2006.01)
- *G06T 19/20* (2011.01)
- *G06F 17/50* (2006.01)
- *G06T 17/20* (2006.01)

(52) U.S. Cl.
CPC .......... *G06T 17/10* (2013.01); *G06F 17/5095* (2013.01); *G06T 17/205* (2013.01); *G06T 19/20* (2013.01); *G06T 2219/2012* (2013.01)

(58) Field of Classification Search
CPC ........................... G06T 15/04; G06T 2215/00
USPC ........................................................ 345/420
See application file for complete search history.

(56) References Cited

U.S. PATENT DOCUMENTS

| | | | |
|---|---|---|---|
| 6,072,498 A | 6/2000 | Brittain et al. | |
| 6,538,651 B1 | 3/2003 | Hayman et al. | |
| 6,538,654 B1 * | 3/2003 | Rose | G06T 13/20 |
| | | | 345/473 |
| 2014/0198097 A1 | 7/2014 | Evans | |
| 2016/0155261 A1 * | 6/2016 | Iborra Olba | G06T 15/506 |
| | | | 345/426 |

OTHER PUBLICATIONS

"International Search Report" and "Written Opinion of the International Searching Authority," Patent Cooperation Treaty Application No. PCT/EP2018/074775, dated Nov. 20, 2018, 16 pages.

* cited by examiner

Primary Examiner — Thomas J Lett
(74) Attorney, Agent, or Firm — Carr & Ferrell LLP

(57) ABSTRACT

Visual optimization of three dimensional models in computer automated design is disclosed herein. An example method includes receiving a three dimensional model having a first rendering complexity level, displaying the three dimensional model in such a way that areas of complexity are visually distinct from other areas, based on an optimization schema applied to the three dimensional model, applying the optimization schema to decimate the areas of complexity such that the three dimensional model can be rendered at a second rendering complexity level, the decimation being bounded by a visual quality level for the three dimensional model, and displaying the three dimensional model at the second rendering complexity level on a display system.

20 Claims, 8 Drawing Sheets

VISUAL OPTIMIZATION OF THREE DIMENSIONAL MODELS IN COMPUTER AUTOMATED DESIGN

FIELD OF THE PRESENT DISCLOSURE

The present disclosure relates generally to computer automated design and three dimensional modeling, and more particularly but not by way of limitation, to systems and methods that allow for visual optimization of three dimensional models, allowing the three dimensional models to be reduced in complexity so as to be rendered efficiently and with a specified and selectable level of visual detail.

SUMMARY

Various embodiments of the present disclosure are directed to a method of visualization optimization during three dimensional modeling, the method comprising: (a) establishing a frame rate threshold for a display system; (b) selectively adjusting, for areas of complexity of a three dimensional model, node parameters from a first rendering complexity level to a second rendering complexity level in such a way that the three dimensional model can be displayed at the frame rate threshold, wherein the three dimensional model at the first rendering complexity level cannot be displayed at the frame rate threshold; and (c) displaying the three dimensional model at the second rendering complexity level on the display system.

Various embodiments of the present disclosure are directed to a method of visualization optimization during three dimensional modeling, the method comprising: (a) receiving a three dimensional model having a first rendering complexity level; (b) displaying the three dimensional model in such a way that areas of complexity are visually distinct from other areas, based on an optimization schema applied to the three dimensional model; (c) applying the optimization schema to decimate the areas of complexity such that the three dimensional model can be rendered at a second rendering complexity level, the decimation being bounded by a visual quality level for the three dimensional model; and (d) displaying the three dimensional model at the second rendering complexity level on the display system.

Various embodiments of the present disclosure are directed to a method comprising: (a) receiving a three dimensional model, the three dimensional model comprising nodes having node parameters and an associated complexity related to a level of visual detail; (b) locating areas of complexity in the nodes; (c) reducing a complexity of at least a portion of the areas of complexity by reducing the level of visual detail thereof; and (d) rendering a visually optimized version of the three dimensional model using the reduced complexity portions of the three dimensional model.

BRIEF DESCRIPTION OF THE DRAWINGS

The accompanying drawings, where like reference numerals refer to identical or functionally similar elements throughout the separate views, together with the detailed description below, are incorporated in and form part of the specification, and serve to further illustrate embodiments of concepts that include the claimed disclosure, and explain various principles and advantages of those embodiments.

The methods and systems disclosed herein have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

DESCRIPTION OF EXEMPLARY EMBODIMENTS

Figure 1:
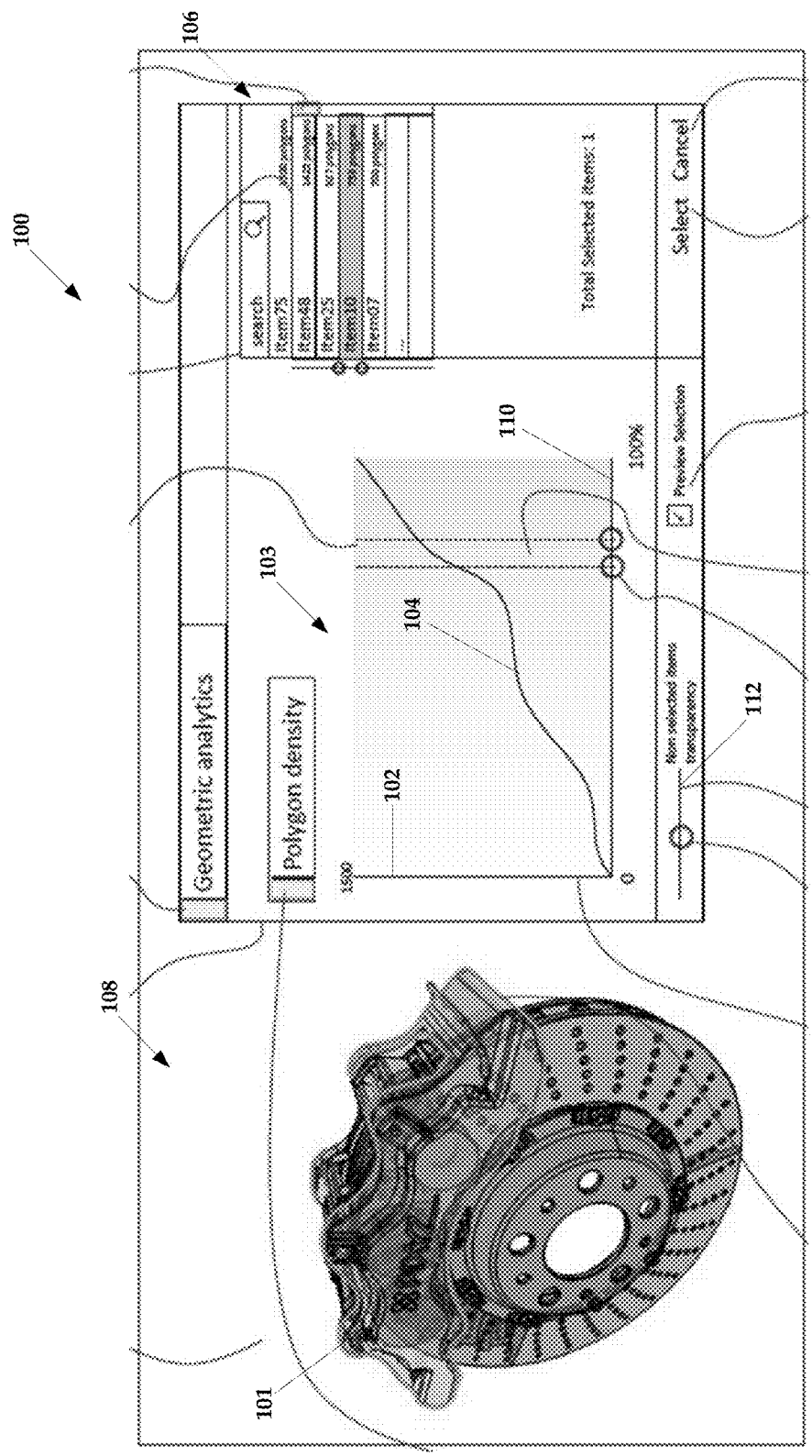
FIG. 1 is a screenshot of an example graphical user interface (GUI) that is used to practice aspects of the present disclosure.

For context, computer automated design ("CAD") systems are used to design, simulate and manufacture physical objects. CAD systems allow users to create accurate, complex, and detailed digital representations of objects in a three dimensional ("3D") space. Based on the final usage scenario, those 3D models may benefit from optimization through modification in order to be visualized smoothly in real-time (meaning high computer graphics performances) or to be imported from one CAD system to another.

A typical usage scenario, requiring object's optimization process, would be the need for a car manufacturing engineer to review a complete CAD model of a new car in a virtual reality system. Virtual reality systems usually require an ability to display computer generated frames at a high rate (for example 90 frame per second for a head mounted display). CAD car models are often so complex (in visual detail) that the CAD system is not able to display a complete car structure at such frame rates.

The CAD engineer will spend some time to prepare the car model in order to fulfill the virtual reality frame rate requirement. The process could comprise tessellating geometry of the 3D model or decimating polygon numbers of meshes, removing hidden or unnecessary parts, adjusting holes/bumps and mesh accuracy, or even removal of holes and bumps, applying materials and textures, and so forth—just to name a few.

This optimization process described above requires time and subjective expertise to achieve a desired optimization. Using subjective criteria for optimization, the user will have to identify and select every part of the model which needs to be optimized or removed in order to prepare the final optimized 3D model. For instance, the user may decide to simplify the polygon density of a specific part depending on the final visual geometric fidelity desired for retention. To be sure, the more a mesh is decimated, the less accurate is the surface geometry. Optimizations can be applied on various kinds of data like tessellation sag, polygon count, vertex number, hole or bumps curvature parameter, product structure hierarchy, naming, visibility, function, material naming, and other parameters that would be known to one of ordinary skill in the art with the present disclosure before them.

Due to the huge variety of CAD assemblies which compose the digital mockup of a car, the workload can be significantly high and resulting optimized models may be bounded by the subjective preferences of the user, which may result in a final 3D model that is poorly optimized or is visually undesirable. For example, the selected optimizations for the model specified by the user may result in a model that omits detail which is necessary while including details that are superfluous. By way of specific example, the user may fail to omit unnecessary items such as fasteners, while removing details such as surface geometries that are necessary to the viewer.

Thus it is desirable to provide an objective, machine oriented solution for identifying, classifying and displaying parts of a 3D model according to node parameter complexities such as polygon count, vertex number, hole or bumps curvature parameter, product structure hierarchy, naming, visibility, function, material naming, and so forth. Providing a GUI for displaying these quantitative analytic classifications would aid the user in accurately and quickly selecting the parts to optimize within the 3D model. These parts that are to be reduced in complexity are referred to herein as areas of complexity.

In general, the present disclosure is directed to optimizing computer aided designs of 3D models. In some embodiments, 3D model structures are optimized in a way that maintains visual perceived quality of the 3D model while optimizing computer rendering performance. Thus, the present disclosure provides for increased computing efficiency when rendering three dimensional models while not sacrificing visual details that are required for the end user. This required level of visual detail can be related to a frame rate at which the 3D model is displayed, which in turn relates to the capabilities of the display system. Thus, a reduction in complexity of a 3D model, according to the present disclosure, is bound to capabilities of hardware in the display system. In other instances, the reduction in complexity of a 3D model can be related to a required visual perception level of the user. This can be a selectable parameter for the system, where the user could, for example, set a visual detail/perception threshold for the 3D model optimization process. While these can be tailored to the individual user, standardized visual detail/perception thresholds can be determined empirically and used as a baseline or benchmark for the present disclosure.

According to some embodiments, the present disclosure is directed to a semi-automatic method and apparatus for detecting, displaying and selecting objects in a CAD system. Visualization optimization algorithms in a computer-aided design (CAD) system include determining which parts (e.g., nodes) of the CAD model require a correction, such as areas of complexity in the 3D model. Example node types include meshes, hierarchy structure, nurbs, edges, polygons, faces, vertices, and so forth.

The systems and methods can then perform any combination of geometry simplification, polygon count reduction, hidden objects removal, and so forth. Again, this is conducted in such a way that visual perceived quality of the 3D model is maintained while computer graphics rendering performances are optimized.

The present disclosure, in some embodiments, provides GUIs that allow a design engineer to semi-automatically identify and select parts of the CAD model that may need corrections, based on quantitative analytics algorithms processed on the CAD model and configurable with different complexity reduction criteria or schema(s).

An example method includes evaluation of the 3D model using quantitative analytics algorithms and a dedicated graphical user interface (GUI) which then allows the user to refine the parts selection, based on variable complexity reduction criteria.

In some embodiments, the present disclosure is directed to a format conversion and optimization toolset which allows a design engineer to import a CAD 3D model, optimize and export the 3D model as a new file (optionally), in order to reuse it in another visualization program(s). This process can be used when an original CAD model will be loaded in different third party visualization programs and may not load at an initial or first rendering complexity level when used in the third party visualization programs. Also, the optimized model will make the third-party visualization program run more efficiently or load larger 3D models.

The design engineer can utilize systems and methods of the present disclosure to define and process an optimization strategy for the specific imported 3D model.

In an example use case, an example of the 3D model of a car is being optimized. The user may desire to tessellate nurbs data into meshes, repair some polygons and faces normal, remove some hidden parts of the car, and then decimate the number of polygons. The decimation of polygons may use different decimation parameters per parts, depending on a final precision of the mesh the user wants to apply. It also may require balancing between a final visual quality and a final performance gain obtained with lower polygons. Typically, an exterior of a model will have the highest precision possible and less important parts, like small fasteners, will have low precision.

The solution will ease the workload required by the design engineer to optimize the 3D model by automatic and user-selected decimation of a 3D model from a first rendering quality level to a second rendering quality level, where the second rendering quality level includes selective reductions in quality to areas of complexity in the original version of the 3D model.

The present disclosure implements quantitative analytics algorithms against the 3D model, so as to display results of these analyses. GUIs generated by the systems and methods allow users to quickly identify which parts (e.g., nodes/objects) need which kind of optimization, depending on the strategy selected by the user. Based on those quantitative analysis and results visualization, a GUI will also allow the user to quickly and precisely select the parts of the 3D model optimization that the algorithms will be applied to.

Systems and methods disclosed herein perform a series of quantitative analytics algorithms in order to quantify and store in program memory a map of polygon density contained in a volume made by a 3D model loaded into the system. This quantification will be performed on other parameters like curvature angle density, edge sharpness density, node surface, node volume, node bounding box size, node name, node hierarchy complexity, node meta-data, and so forth.

A control GUI 100 as illustrated in FIG. 1 is then displayed. The GUI 100 comprises a 3D model 101 that represents, for example a brake pad and caliper assembly.

The control GUI 100 allows a user to select a family of quantitative analytics to execute against the 3D model and then specific parameters the user is interested in visualizing. If the user selects the "geometric analytics" category and then "Polygon density" parameter from the GUI, the curve and axis of a gradient map area 103 will display the following results: (102) number of polygons on vertical axis (from 0 to maximum number contained in a part); (104) a curve showing the progression of polygons count for each percentage value of the total number of parts in the 3D scene area 108; and (106) a global list of parts sorted out from a highest polygon count to a lowest.

Other selectable quantitative analytics include product structure materials, physical structures, and other definable criteria for the 3D model. In addition to polygon density, the user could select other node parameters related to geometric analysis such as triangle count, curvature analysis, holes density, edge sharpness, surfaces, volumes, bounding box size, or other user defined criteria.

In the 3D scene area 108, an action will change material colors of the 3D model in a "heat map" way. For example, a lighter color means less density of polygons and a darker color means high density. The user can then select a range of parts disposed on a percentage axis 110. This will highlight the selected parts in the 3D scene area 108, as well as in the "item" list 106.

The user can refine a selection from the "item" list by manually clicking on items in the list in order to add or remove some item from the final selection. From that selection, the system will then process those selected parts (nodes within areas of complexity identified as having a high level of polygon density) according to the selected quantitative analytics algorithm. For example, polygon density decimation will include removing polygon surfaces and edges from selected areas of the 3D model (nodes within areas of complexity identified as having a high level of polygon density).

The user can also select a transparency level of non-selected items with slider 112.

An example use case is illustrated in FIGS. 2A-G, which collectively illustrate the optimization of a three dimensional model. To be sure, the 3D model 200 represents a brake pad 201 and caliper 203 of a vehicle. The 3D model in FIG. 2A has a plurality of nodes, such as caliper surfaces, brake pad surfaces and edges, as well as holes/apertures, fasteners, and other features. These nodes can be comprised of further sub-sections or segments such as faces, lines, and so forth, referred to herein as polygons and lines. Each of the nodes includes one or more node parameters for the 3D model such as polygon count, vertex number, holes, bumps, curvature, product structure hierarchy, naming, visibility, function, material naming, and any combinations thereof. These are all attributes that can define aspects of the nodes or objects in the 3D model. Other parameters can be utilized in accordance with the present disclosure.

This 3D model is loaded for optimization. It will be understood that the 3D model 200 has a first rendering complexity level. This level is defined by all available node parameters of all nodes, as well as any parameters for the 3D model as a whole.

Figure 2A:
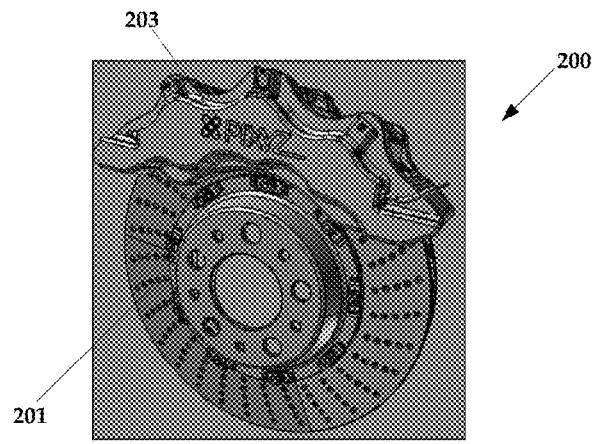
FIGS. 2A-G are screenshots that collectively illustrate a process of visually optimizing a three dimensional model in accordance with the present disclosure.
Figure 2B:
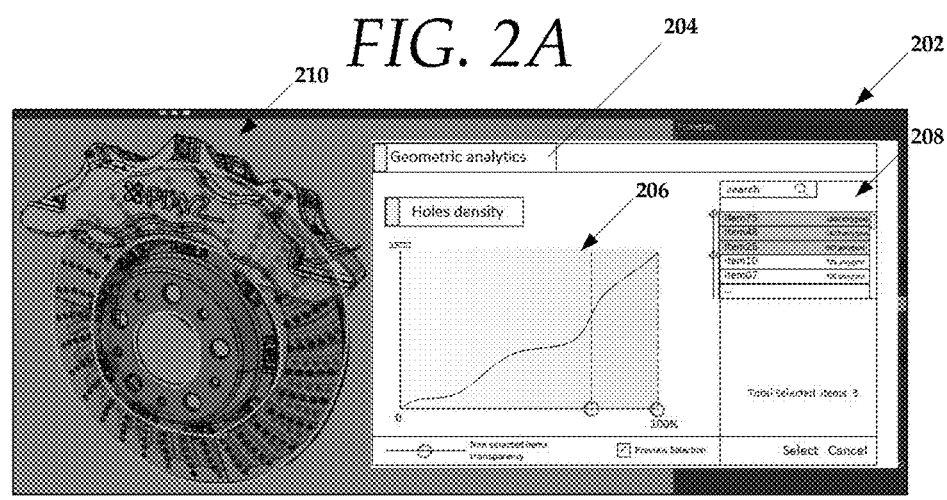

When a full inventory of nodes of the 3D model is loaded, an interface, such as GUI 202 is presented to the user as in FIG. 2B. The GUI 202 provides a dropdown toolset 204 that allows a user to select one of a plurality of quantitative assessments to perform against the 3D model 200. For example, a selection of geometric analytics is selected. The user then picks a subset of the geometric analytics, such as holes density.

Figure 2C:
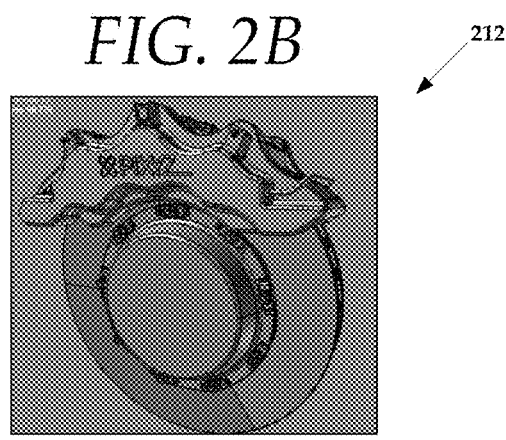
Figure 2D:
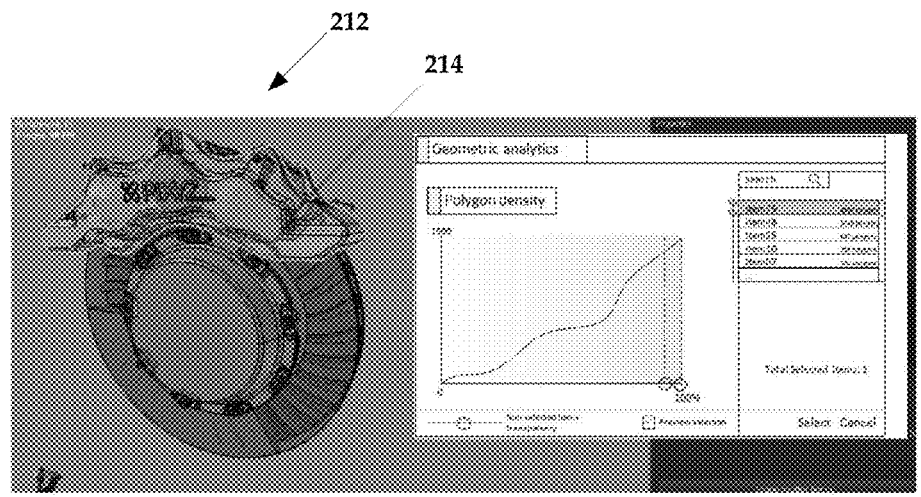
Figure 2E:
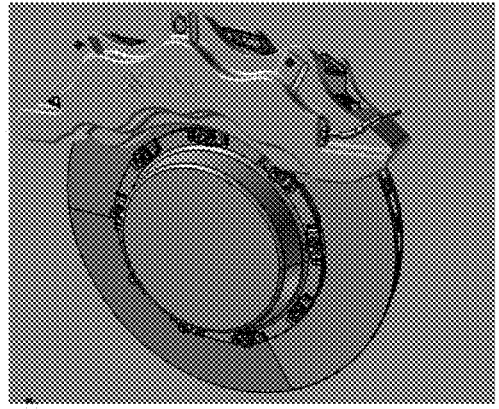

Upon selection, geometric analytics algorithm related to hole density is executed against the 3D model creating a graphical representation 206 and list 208 that corresponds to the graphical representation 206. The areas with large hole densities are outlined on the 3D model 210 and corresponding list items are darkened by selection by the user or automatic selection by the optimization system that provides the GUI. These areas are referred to as areas of complexity. The user can execute the system to regenerate the 3D model to remove large density holes, which would otherwise create complexities during rendering. A regenerated 3D model 212 with holes removed is illustrated in FIG. 2C. In a second optimization process, as illustrated in FIGS. 2D-E, the user can select polygon density, which allows the optimization system to remove high density polygon areas, as identified in area 214 on the regenerated 3D model 212.

The optimization system then decimates polygons in this area to create a second regenerated 3D model 216.

Figure 2F:
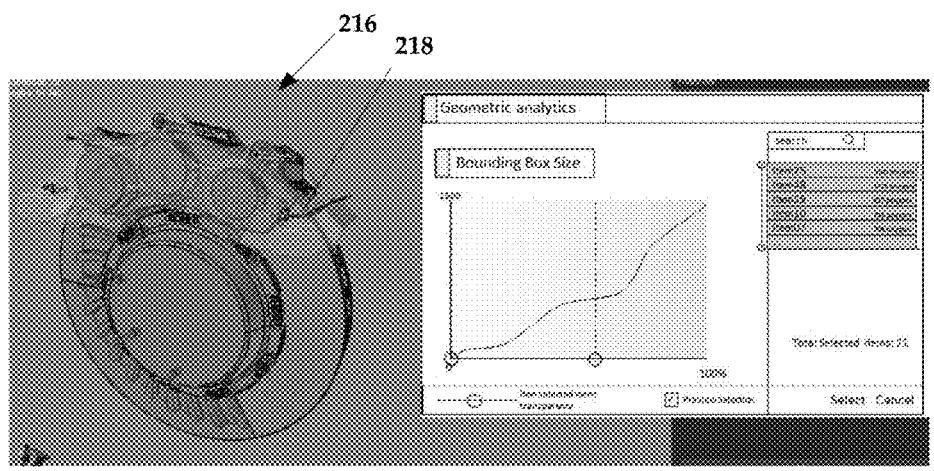
Figure 2G:
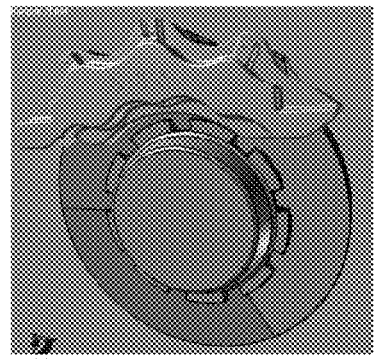

In FIGS. 2F-G, the user selects yet another optimization that includes a bounding box size algorithm that identifies nodes with a size that is below a specified dimension. These areas of complexity, such as area 218, are highlighted in the second regenerated 3D model 216. The optimization system then decimates these small sized areas of complexity to create a third regenerated 3D model 220. This effectively removes rendering of small objects (e.g., nodes) such as fasteners, brake lines, clips, and so forth. Each step of regenerating the 3D model results in a 3D model that has a rendering complexity that is less than the 3D model from which it was created.

Additional areas of complexity for other node parameters can be identified and decimated to further reduce the rendering complexity of the 3D model. As mentioned above, an example use case for optimizing the 3D model 200 would include a situation in which the 3D model 200 would need to be rendered in real time at a frame rate of 90 frames per second. It will be assumed that the complexity level of the 3D model 200 would not allow for rendering at 90 frames per second. The third regenerated 3D model 220, having a plurality of areas of complexity removed, would render at 90 frames per second.

In another embodiment, the aspect of visual perceptibility or quality can be used to bound the removal of areas of complexity. For example, if it is critical to the end user that small features remain visible, the optimization system may select other node parameters than bounding box size, such as curvature removal in order to reduce complexity but retain small sized nodes.

In sum, the systems and methods can optimize 3D models by selective adjusting areas of complexity in the 3D model, for example, by decimating or removing these areas of complexity. Remaining portions of the 3D model remain for rendering.

Figure 3:
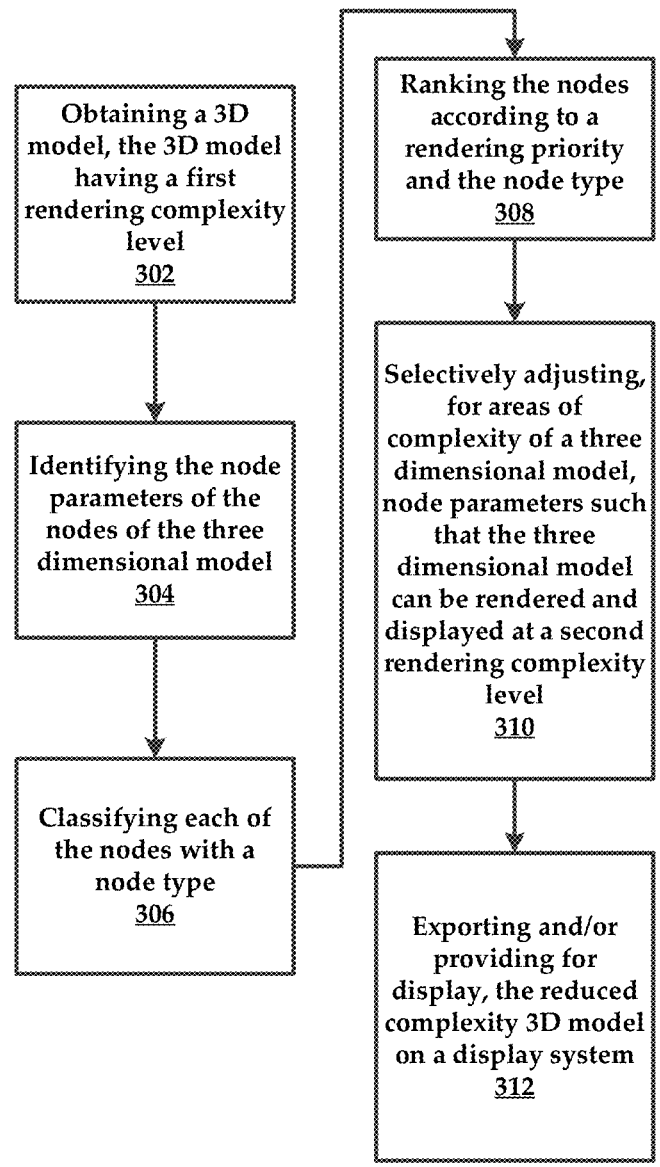
FIG. 3 is a flowchart of an example method of optimizing a three dimensional model for efficient rendering.

FIG. 3 is a flowchart of an example method of the present disclosure. The method comprises a step 302 of obtaining a 3D model, the 3D model having a first rendering complexity level. The first rendering complexity level is the full 3D model that will be reduced in complexity for more efficient rendering.

As mentioned above, the 3D model comprises a plurality of nodes that each includes node parameters.

In some embodiments, the method includes a step 304 of identifying the node parameters of the nodes of the three dimensional model, as well as a step 306 of classifying each of the nodes with a node type. Next, the method includes a step 308 of ranking the nodes according to a rendering priority and the node type.

By way of non-limiting example, a method of adjusting a "polygon count" node parameter allows for identification of a polygon count for each part of a 3D assembly. The method then allows for sorting of each part by polygon count (from highest to lowest polygon count for instance). The system can then suggest to the user a reduced polygon count target according to a rendering frame rate target.

According to some embodiments, once the high complexity 3D model has been parsed and evaluated on a node level, the method includes a step 310 of selectively adjusting, for areas of complexity of a three dimensional model, node parameters such that the three dimensional model can be rendered and displayed at a second rendering complexity level. For example, node parameters such as polygon density, bounding box size, hole density, and other parameters can be used to reduce the complexity of the 3D model.

The method comprises a step 312 of exporting and/or providing for display, the reduced complexity 3D model on a display system.

Figure 4:
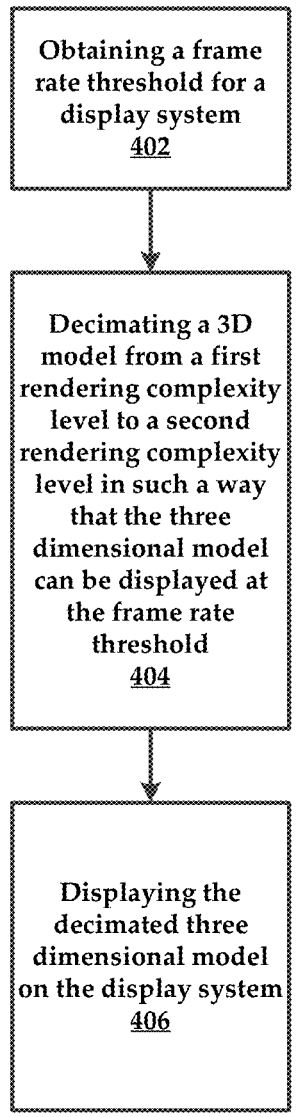
FIG. 4 is a flowchart of an example method of optimizing a three dimensional model for efficient rendering, based on frame rate thresholds or visual quality bounding.

As mentioned above, some embodiments include reducing a rendering complexity of a 3D model so that the 3D model can be displayed in accordance with hardware and/or software limitations of a display system. The method of FIG. 4 illustrates another example method for rendering a 3D model in an optimized manner based on hardware limitations of a display device. The method includes a step 402 of obtaining a frame rate threshold for a display system. This frame rate threshold is used to define a complexity level of an optimized 3D model created from a high resolution/complexity 3D model. The method can include a step 404 of decimating a 3D model from a first rendering complexity level to a second rendering complexity level in such a way that the three dimensional model can be displayed at the frame rate threshold. To be sure, the three dimensional model at the first rendering complexity level would not be displayable at the frame rate threshold by the selected display system based on the frame rate capabilities of the display system. Once the 3D model has been decimated, the method includes a step 406 of displaying the decimated three dimensional model on the display system.

Again, the decimation involves adjusting node parameters of nodes in areas of complexity in the 3D model. Example node parameters comprise any of polygon count, vertex number, holes, bumps, curvature, product structure hierarchy, naming, visibility, function, material naming, and any combinations thereof.

In general, selectively adjusting includes reducing any of the node parameters from the first rendering complexity level to the second rendering complexity level. For example, removing large numbers of small holes in a plate, and removing small caliber fasteners or high density polygon areas of a 3D model.

According to some embodiments, selectively adjusting an area of complexity can include, but is not limited to tessellating NURBs data into meshes, repairing a portion of polygons and faces, removing hidden parts, and decimating a number of polygons, and any combinations thereof—just to name a few. It will be understood that a CAD tessellation comprises any of rendering(s) of computer aided designs and the generating of a solid mesh from a mathematical surface description of these computer aided designs (NURBs).

In some embodiments, the method can include the system selecting (or a user selecting and the system receiving) an optimization schema for the three dimensional model. An optimization schema can include, for example, polygon decimation, high density hole decimation, part size boundary decimation (where objects smaller than a specified dimension are removed), and so forth. The optimization schema specifies the areas of complexity of the three dimensional model which require selective adjustment of node parameters. For example, in FIG. 2B, the user selects and the system receives an optimization schema selection of hole density, which allows for high density hole decimation in the 3D model.

In some instances, the system can display areas of complexity in such a way that the areas of complexity are visually distinct from other areas. This is referred to generally herein as heat mapping of nodes on a 3D model. Returning back to FIG. 2B, areas of high density holes are heat mapped such that brake pad 201 is colored red while caliper 203 is colored orange.

Figure 5:
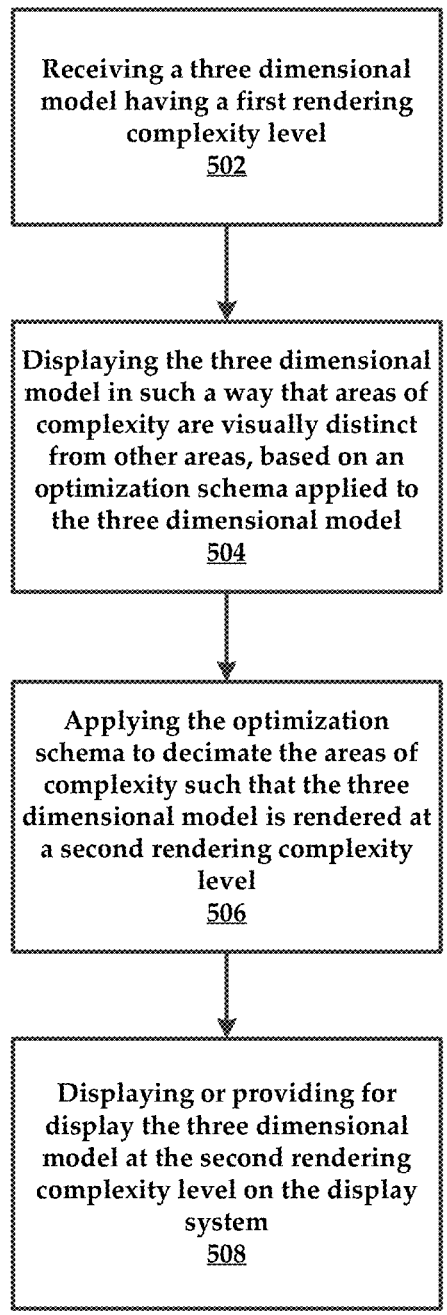
FIG. 5 is a flowchart of a method decimating a 3D model using quantitative analytic schemes to create a reduced complexity version of the 3D model for efficient rendering.

FIG. 5 illustrates another method of the present disclosure that includes a step 502 of receiving a three dimensional model having a first rendering complexity level. Next, the method comprises a step 504 of displaying the three dimensional model in such a way that areas of complexity are visually distinct from other areas, based on an optimization schema applied to the three dimensional model. For example, the user can select optimization schemas such as hole density, polygon density, and so forth.

The user can then execute the system to perform a step 506 of applying the optimization schema to decimate the areas of complexity such that the three dimensional model is rendered at a second rendering complexity level. Again, the process of decimation is bounded by a visual quality level for the three dimensional model. For example, the user can set parameters such as polygon density levels, hole density levels, and so forth that prevent decimation of the 3D model beyond a quality level preferred by the user. The process of decimation should be understood to be an example of selective adjustment of node parameters. That is, other processes can be used to reduce a complexity of a 3D model for efficient rendering other than decimation. These process are also configurable to provide functions such as hidden object removal, hole or bump removal, part hierarchy simplification, merging of meshes and assemblies, face normal repair options, and any combinations thereof—just to name a few.

As with other methods, a step 508 of displaying or providing for display the three dimensional model at the second rendering complexity level on the display system is then performed.

As mentioned above, applying the optimization schema can include quantifying a map of node parameters contained in a volume made by the three dimensional model. The map can be used to create the graphical representations, such as graphical representation 206 and/or list 208 of FIG. 2B. Examples of node parameters can include any of polygon density, curvature angle density, edge sharpness density, surface, volume, bounding box size, name, hierarchy complexity, metadata, and combinations thereof, as well as any other node parameters described herein and/or would be known to one of ordinary skill in the art with the present disclosure before them.

In some embodiments, the method can include allowing the user to select an area of complexity in the 3D model and decimating only nodes within the selected area. For example, in FIG. 2B, the user could select only a portion of the brake pad 201 for decimation and removal of hole density rather the entirety of the brake pad 201. The optimization schema that is applied would only be executed against the selected portions of the 3D model. This can be accomplished using the 3D model or the list displayed on the GUI.

In yet another embodiment, a method for creating a reduced complexity 3D model can include a step of receiving a three dimensional model. As mentioned above, the three dimensional model comprises nodes that have node parameters and an associated complexity related to a level of visual detail. That is, each part of the 3D model has a complexity level associated therewith. The method can include locating areas of complexity in the nodes based on quantitative analytics executed against the 3D model.

The method includes reducing a complexity of at least a portion of the areas of complexity by reducing the level of visual detail thereof. For example the areas of complexity could include polygonal faces with numerous edges. Removing edges/lines of definition of the polygons will reduce complexity of the 3D model.

In some embodiments, the method includes rendering a visually optimized version of the three dimensional model using the reduced complexity portions of the three dimensional model. To be sure, in some embodiments, the complexity is reduced to allow the visually optimized version to be displayed on a visualization program or device that could not render the three dimensional model.

In one or more embodiments, the complexity is reduced according to a precision level of a mesh applied to the three dimensional model. In some embodiments, the number of polygons of a mesh can be reduced or redistributed over the surface in an intelligent manner based on a level of precision related to a relatively low, acceptable, fixed polygon target number, frame rate target, and other similar or related constraints.

Figure 6:
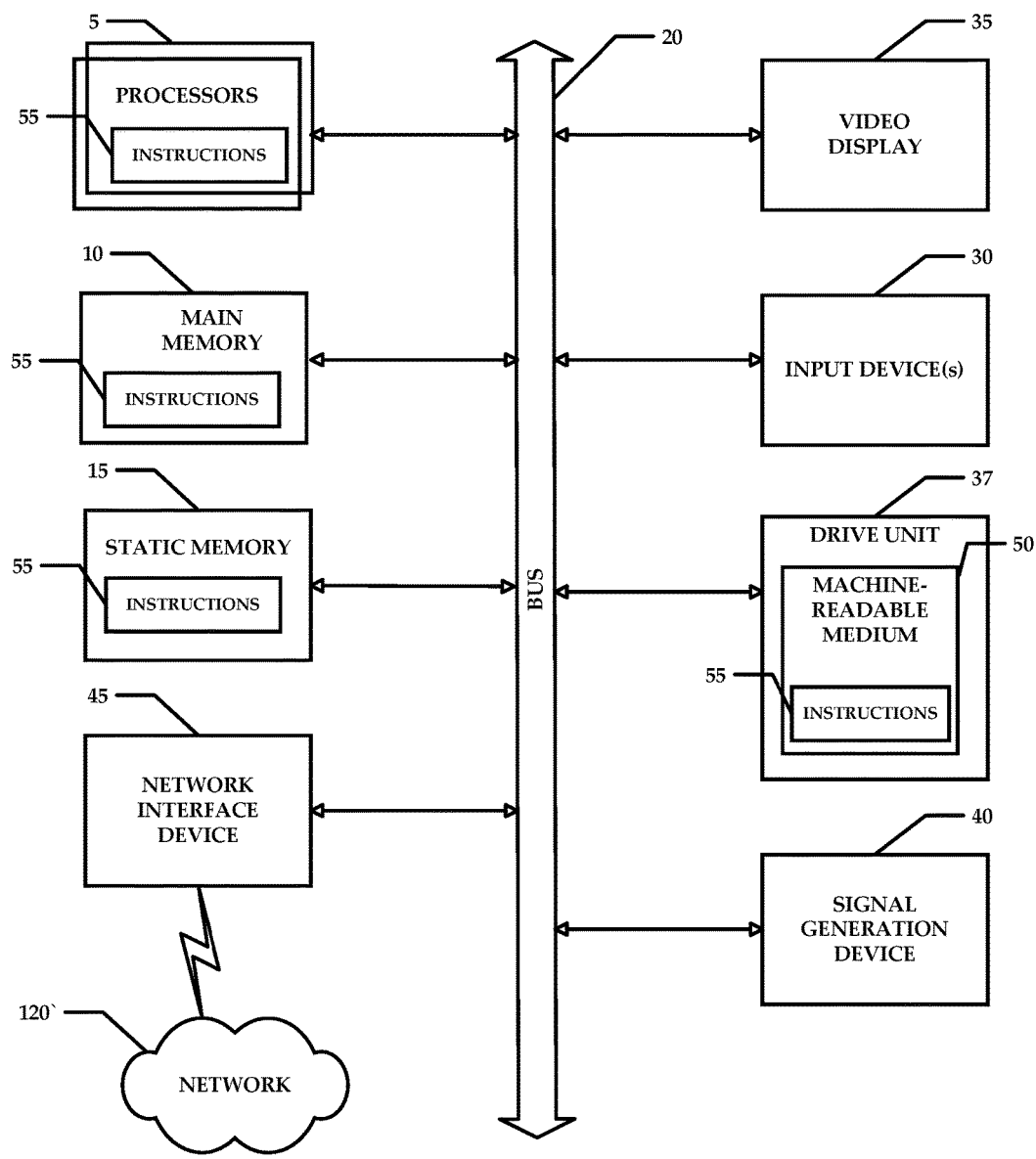
FIG. 6 is a schematic diagram of an example computer system that can be used to practice aspects of the present disclosure.

FIG. 6 is a diagrammatic representation of an example machine in the form of a computer system 1, within which a set of instructions for causing the machine to perform any one or more of the methodologies discussed herein may be executed. In various example embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be a personal computer (PC), a tablet PC, a set-top box (STB), a personal digital assistant (PDA), a cellular telephone, a portable music player (e.g., a portable hard drive audio device such as an Moving Picture Experts Group Audio Layer 3 (MP3) player), a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 1 includes a processor or multiple processor(s) 5 (e.g., a central processing unit (CPU), a graphics processing unit (GPU), or both), and a main memory 10 and static memory 15, which communicate with each other via a bus 20. The computer system 1 may further include a video display 35 (e.g., a liquid crystal display (LCD)). The computer system 1 may also include an alpha-numeric input device(s) 30 (e.g., a keyboard), a cursor control device (e.g., a mouse), a voice recognition or biometric verification unit (not shown), a drive unit 37 (also referred to as disk drive unit), a signal generation device 40 (e.g., a speaker), and a network interface device 45. The computer system 1 may further include a data encryption module (not shown) to encrypt data.

The disk drive unit 37 includes a computer or machine-readable medium 50 on which is stored one or more sets of instructions and data structures (e.g., instructions 55) embodying or utilizing any one or more of the methodologies or functions described herein. The instructions 55 may also reside, completely or at least partially, within the main memory 10 and/or within the processor(s) 5 during execution thereof by the computer system 1. The main memory 10 and the processor(s) 5 may also constitute machine-readable media.

The instructions 55 may further be transmitted or received over a network (e.g., network 120) via the network interface device 45 utilizing any one of a number of well-known transfer protocols (e.g., Hyper Text Transfer Protocol (HTTP)). While the machine-readable medium 50 is shown in an example embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. The term "computer-readable medium" shall accordingly be taken to include, but not be limited to, solid-state memories, optical and magnetic media, and carrier wave signals. Such media may also include, without limitation, hard disks, floppy disks, flash memory cards, digital video disks, random access memory (RAM), read only memory (ROM), and the like. The example embodiments described herein may be implemented in an operating environment comprising software installed on a computer, in hardware, or in a combination of software and hardware.

One skilled in the art will recognize that the Internet service may be configured to provide Internet access to one or more computing devices that are coupled to the Internet service, and that the computing devices may include one or more processors, buses, memory devices, display devices, input/output devices, and the like. Furthermore, those skilled in the art may appreciate that the Internet service may be coupled to one or more databases, repositories, servers, and the like, which may be utilized in order to implement any of the embodiments of the disclosure as described herein.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the present disclosure in the form disclosed. Many modifications and variations will be apparent to those of ordinary skill in the art without departing from the scope and spirit of the present disclosure. Exemplary embodiments were chosen and described in order to best explain the principles of the present disclosure and its practical application, and to enable others of ordinary skill in the art to understand the present disclosure for various embodiments with various modifications as are suited to the particular use contemplated.

Aspects of the present disclosure are described above with reference to flowchart illustrations and/or block diagrams of methods, apparatus (systems) and computer program products according to embodiments of the present disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

While this technology is susceptible of embodiment in many different forms, there is shown in the drawings and will herein be described in detail several specific embodiments with the understanding that the present disclosure is to be considered as an exemplification of the principles of the technology and is not intended to limit the technology to the embodiments illustrated.

The terminology used herein is for the purpose of describing particular embodiments only and is not intended to be limiting of the technology. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that like or analogous elements and/or components, referred to herein, may be identified throughout the drawings with like reference characters. It will be further understood that several of the figures are merely schematic representations of the present disclosure. As such, some of the components may have been distorted from their actual scale for pictorial clarity.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In the following description, for purposes of explanation and not limitation, specific details are set forth, such as particular embodiments, procedures, techniques, etc. in order to provide a thorough understanding of the present invention. However, it will be apparent to one skilled in the art that the present invention may be practiced in other embodiments that depart from these specific details.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" or "according to one embodiment" (or other phrases having similar import) at various places throughout this specification are not necessarily all referring to the same embodiment. Furthermore, the particular features, structures, or characteristics may be combined in any suitable manner in one or more embodiments. Furthermore, depending on the context of discussion herein, a singular term may include its plural forms and a plural term may include its singular form. Similarly, a hyphenated term (e.g., "on-demand") may be occasionally interchangeably used with its non-hyphenated version (e.g., "on demand"), a capitalized entry (e.g., "Software") may be interchangeably used with its non-capitalized version (e.g., "software"), a plural term may be indicated with or without an apostrophe (e.g., PE's or PEs), and an italicized term (e.g., "N+1") may be interchangeably used with its non-italicized version (e.g., "N+1"). Such occasional interchangeable uses shall not be considered inconsistent with each other.

Also, some embodiments may be described in terms of "means for" performing a task or set of tasks. It will be understood that a "means for" may be expressed herein in terms of a structure, such as a processor, a memory, an I/O device such as a camera, or combinations thereof. Alternatively, the "means for" may include an algorithm that is descriptive of a function or method step, while in yet other embodiments the "means for" is expressed in terms of a mathematical formula, prose, or as a flow chart or signal diagram.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is noted at the outset that the terms "coupled," "connected", "connecting," "electrically connected," etc., are used interchangeably herein to generally refer to the condition of being electrically/electronically connected. Similarly, a first entity is considered to be in "communication" with a second entity (or entities) when the first entity electrically sends and/or receives (whether through wireline or wireless means) information signals (whether containing data information or non-data/control information) to the second entity regardless of the type (analog or digital) of those signals. It is further noted that various figures (including component diagrams) shown and discussed herein are for illustrative purpose only, and are not drawn to scale.

While specific embodiments of, and examples for, the system are described above for illustrative purposes, various equivalent modifications are possible within the scope of the system, as those skilled in the relevant art will recognize. For example, while processes or steps are presented in a given order, alternative embodiments may perform routines having steps in a different order, and some processes or steps may be deleted, moved, added, subdivided, combined, and/or modified to provide alternative or sub-combinations. Each of these processes or steps may be implemented in a variety of different ways. Also, while processes or steps are at times shown as being performed in series, these processes or steps may instead be performed in parallel, or may be performed at different times.

While various embodiments have been described above, it should be understood that they have been presented by way of example only, and not limitation. The descriptions are not intended to limit the scope of the invention to the particular forms set forth herein. To the contrary, the present descriptions are intended to cover such alternatives, modifications, and equivalents as may be included within the spirit and scope of the invention as defined by the appended claims and otherwise appreciated by one of ordinary skill in the art. Thus, the breadth and scope of a preferred embodiment should not be limited by any of the above-described exemplary embodiments.

What is claimed is:

1. A method of visualization optimization during three dimensional modeling, the method comprising:
   obtaining a frame rate threshold for a display system;
   selectively adjusting, for areas of complexity of a three dimensional model, node parameters from a first rendering complexity level to a second rendering complexity level in such a way that the three dimensional model can be displayed at the frame rate threshold, wherein the three dimensional model at the first rendering complexity level cannot be displayed at the frame rate threshold by the display system; and
   providing for display the three dimensional model at the second rendering complexity level on the display system.

2. The method according to claim 1, wherein selectively adjusting further comprises:
   identifying the node parameters of nodes of the three dimensional model;
   classifying each of the nodes with a node type; and
   ranking the nodes according to a rendering priority and the node type.

3. The method according to claim 2, wherein the node parameters comprise any of polygon count, vertex number, holes, bumps, curvature, product structure hierarchy, naming, visibility, function, material naming, and any combinations thereof.

4. The method according to claim 3, wherein selectively adjusting comprises reducing any of the node parameters to allow the three dimensional model having the first rendering complexity level to be converted to the second rendering complexity level.

5. The method according to claim 3, wherein selectively adjusting comprises any of tessellating nurbs data into meshes, repairing a portion of polygons and faces, removing hidden parts, and decimating a number of polygons, and any combinations thereof.

6. The method according to claim 1, further comprising selecting an optimization schema for the three dimensional model, wherein the optimization schema allows for identification of the areas of complexity of the three dimensional model which require selective adjustment.

7. The method according to claim 1, further comprising rendering the three dimensional model at the first rendering complexity level in such a way that the areas of complexity are visually distinct from other areas.

8. The method according to claim 7, further comprising applying an optimization schema to the areas of complexity to decimate the areas of complexity.

9. A method of visualization optimization during three dimensional modeling, the method comprising:
   receiving a three dimensional model having a first rendering complexity level;
   displaying the three dimensional model in such a way that areas of complexity are visually distinct from other areas, based on an optimization schema applied to the three dimensional model;
   applying the optimization schema to decimate the areas of complexity such that the three dimensional model can be rendered at a second rendering complexity level, the decimation being bounded by a visual quality level for the three dimensional model; and
   displaying the three dimensional model at the second rendering complexity level on a display system.

10. The method according to claim 9, wherein applying the optimization schema comprises quantifying a map of node parameters contained in a volume made by the three dimensional model.

11. The method according to claim 10, wherein the node parameters comprise any of polygon density, curvature angle density, edge sharpness density, surface, volume, bounding box size, name, hierarchy complexity, metadata, and combinations thereof.

12. The method according to claim 11, further comprising:
   receiving a selection of one or more of the node parameters; and
   rendering the three dimensional model in such a way that the areas of complexity having the one or more of the node parameters are displayed in a visually distinct manner compared to the other areas.

13. The method according to claim 12, further comprising:
   receiving a selection of one or more of the areas of complexity; and
   selecting the optimization schema based on the selection of the one or more of the areas of complexity.

14. The method according to claim 12, wherein the second rendering complexity level corresponds to a frame rate threshold for the display system.

15. The method according to claim 9, further comprising:
   receiving a selection of an area of complexity in the three dimensional model; and
   decimating one or more nodes within the selected area of complexity.

16. A method, comprising:
   receiving a three dimensional model, the three dimensional model comprising nodes having node parameters and an associated complexity related to a level of visual detail;
   locating areas of complexity in the nodes;
   reducing a complexity of at least a portion of the areas of complexity by reducing the level of visual detail thereof; and rendering a visually optimized version of the three dimensional model using the reduced complexity portions of the three dimensional model.

17. The method according to claim 16, wherein the complexity is reduced to allow the visually optimized version to be displayed on a visualization program that could not render the three dimensional model.

18. The method according to claim 16, wherein the complexity is reduced according to a precision level of a mesh applied to the three dimensional model.

19. The method according to claim 16, further comprising displaying a heat map version of the three dimensional model, the heat map version comprising coloring of the nodes according to their associated complexity.

20. The method according to claim 16, further comprising:
   receiving a selection of an area of complexity in the three dimensional model; and
   decimating one or more nodes within the selected area of complexity.

* * * * *